(12) United States Patent
Choi et al.

(10) Patent No.: US 7,282,990 B2
(45) Date of Patent: Oct. 16, 2007

(54) OPERATIONAL AMPLIFIER FOR OUTPUT BUFFER AND SIGNAL PROCESSING CIRCUIT USING THE SAME

(75) Inventors: Sung-Pil Choi, Suwon-si (KR); Do-Youn Kim, Hwaseong-si (KR); Jae-Wook Kwon, Yongi-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 11/375,952

(22) Filed: Mar. 15, 2006

(65) Prior Publication Data

US 2006/0238238 A1    Oct. 26, 2006

(30) Foreign Application Priority Data

Apr. 22, 2005    (KR) .................... 10-2005-0033573

(51) Int. Cl.
*G06G 7/12*    (2006.01)
(52) U.S. Cl. .................... 327/560; 327/563; 330/253
(58) Field of Classification Search ............. 327/560, 327/563; 330/253
See application file for complete search history.

(56) References Cited

U.S. PATENT DOCUMENTS

| 6,265,941 | B1 * | 7/2001 | Lopata ..................... 330/258 |
| 6,411,162 | B2 | 6/2002 | Minamizaki et al. |
| 6,727,753 | B2 | 4/2004 | Moon |
| 2004/0145413 | A1 | 7/2004 | Moon |

FOREIGN PATENT DOCUMENTS

| JP | 05-102740 | 4/1993 |
| JP | 2001337658 | 12/2001 |

(Continued)

OTHER PUBLICATIONS

English Abstract for Publication No. 2001-337658, Dec. 7, 2001.

(Continued)

*Primary Examiner*—Kenneth B. Wells
(74) *Attorney, Agent, or Firm*—F. Chau & Assoc., LLC

(57) ABSTRACT

An operational amplifier includes: a differential amplifier for differentially amplifying first and second differential input signals to generate first and second output signals through first and second nodes; a driver for driving an output node in response to the second output signal; and a drive current adjuster for adjusting a driving current of the driver in response to the first output signal. The drive current adjuster includes: a first transistor including a drain connected to the output node, a gate, and a source connected to a ground voltage; a second transistor including a gate connected to the first node, a drain, and a source connected to a source voltage; a third transistor including a drain connected to the drain of the second transistor, a source, and a gate connected to a first bias voltage; and a fourth transistor including a drain connected to the source of the third transistor, a source connected to the ground voltage, and a gate connected to a second bias voltage, wherein the gate of the first transistor is commonly connected to the drains of the second and third transistors.

12 Claims, 3 Drawing Sheets

FOREIGN PATENT DOCUMENTS

| | | |
|---|---|---|
| JP | 2003051721 | 2/2003 |
| JP | 20040066546 | 7/2004 |
| KR | 1019940001816 | 3/1994 |
| KR | 1019960016343 | 12/1996 |
| KR | 1999-018189 | 3/1999 |
| KR | 20020095938 | 12/2002 |
| KR | 100414264 | 12/2003 |

OTHER PUBLICATIONS

English Abstract for Publication No. 1020020093938, Dec. 28, 2002.

English Abstract for Publication No. 2003-051721, Feb. 21, 2003.

English Abstract for Publication No. 1020040066546, Jul. 27, 2004.

\* cited by examiner

OPERATIONAL AMPLIFIER FOR OUTPUT BUFFER AND SIGNAL PROCESSING CIRCUIT USING THE SAME

CROSS-REFERENCE TO RELATED PATENT APPLICATION

This application claims priority to Korean Patent Application No. 2005-33573, filed on Apr. 22, 2005, the disclosure of which is herein incorporated by reference in its entirety.

BACKGROUND OF THE INVENTION

1. Technical Field

The present invention relates to an operational amplifier and, more particularly, to an operational amplifier for an output buffer and a signal processing circuit using the same.

2. Description of the Related Art

An operational amplifier (or op-amp for short) is a high-gain differential amplifier. Generally, an operational amplifier includes two input terminals, one inverting (−) and one noninverting (+), and the output of the amplifier is the difference between the "IN+" and "IN−" voltages multiplied by the gain of the amplifier.

FIG. 1 is a circuit diagram of a basic two-stage operational amplifier. Referring to FIG. 1, a two-stage operational amplifier 100 includes a differential amplifier 110 for differentially amplifying a differential pair of input signals IN+ and IN−, and a driver 120 for driving an output node N11 of the differential amplifier 110 according to a bias voltage Vbias and an output signal of the differential amplifier 110. An output load comprising a resistance component and a capacitance component is connected to the output node N11.

The differential amplifier 110 includes NMOS transistors Q1, Q2 and Q5 and PMOS transistors Q3 and Q4. The noninverted and inverted input signals IN+ and IN− are inputted to gates of the NMOS transistors Q1 and Q2, respectively. The PMOS transistors Q3 and Q4 in a current mirror configuration are connected to NMOS transistors Q1 and Q2, respectively. The bias voltage Vbias is applied to the gate of the NMOS transistor Q5.

The driver 120 includes a PMOS transistor Q6 connected to the output node N11 of the differential amplifier 110 to serve as a current source, and an NMOS transistor Q7 serving as a current sink. The PMOS transistor Q6 charges the output load connected to the output node N11, and the NMOS transistor Q7 discharges the output node N11 according to a bias voltage Vbias applied to its gate. For example, when the noninverted input signal IN+ is higher in voltage than the inverted input signal IN−, the voltage level at the output node N11 is lowered and the PMOS transistor Q6 charges the output load connected to the output node N11. When the noninverted input signal IN+ is lower in voltage than the inverted input signal IN−, the voltage level at the output node N11 is increased, which means the PMOS transistor Q6 is turned off and the output node N11 is discharged by the NMOS transistor Q7.

In the above-described operational amplifier 100, the driving capability of the PMOS transistor Q6 is sufficient for charging the output node N11, but the driving capability of the NMOS transistor Q7 for discharging the output node N11 is limited to the quiescent current (i.e., the current when no load is present).

FIG. 2 is a diagram illustrating, both, an input signal 210 inputted to the input terminal of the two-stage operational amplifier shown in FIG. 1, and an output signal 220 outputted through the output node thereof. Referring to FIG. 2, since the PMOS transistor Q6 is controlled by the output signal of the differential amplifier 110 at a rising edge of the input signal 210, the slew rate of the output signal 220 does not matter. Slew rate refers to the maximum rate of change of an amplifier's output signal with respect to its input signal. In essence, slew rate is a measure of an amplifier's ability to follow its input signal.

However, since the NMOS transistor Q7 is controlled by the constant bias voltage Vbias at a falling edge of the input signal 210, time is required to discharge the electric charge stored in the capacitor of the output load which is connected to the output node N11. Therefore, at the time when the output signal 220 falls, slew rate becomes small.

In conventional op-amps, to improve a driving capability of the NMOS transistor Q7, the quiescent current of the NMOS transistor Q7 must be increased. However when the quiescent current of the NMOS transistor Q7 is increased, the power dissipation through the output node N11 is higher than desirable.

In a liquid crystal display (LCD) source driver for driving pixels of an LCD panel where, for example, the number of output buffers corresponds to the number of horizontal pixels, it is undesirable to increase the quiescent current of the NMOS transistor Q7.

SUMMARY OF THE INVENTION

Exemplary embodiments of the present invention are directed to an operational amplifier for an output buffer and a signal processing circuit using the same.

In an exemplary embodiment of the present invention, an operational amplifier includes: a differential amplifier for differentially amplifying first and second differential input signals to generate first and second output signals through first and second nodes; a driver for driving an output node in response to the second output signal; and a drive current adjuster for adjusting a driving current of the driver in response to the first output signal. The drive current adjuster includes: a first transistor including a drain connected to the output node, a gate, and a source connected to a ground voltage; a second transistor including a gate connected to the first node, a drain, and a source connected to a source voltage; a third transistor including a drain connected to the drain of the second transistor, a source, and a gate connected to a first bias voltage; and a fourth transistor including a drain connected to the source of the third transistor, a source connected to the ground voltage, and a gate connected to a second bias voltage, wherein the gate of the first transistor is commonly connected to the drains of the second and third transistors.

The driver may include: a current source transistor controlled by the second output signal to charge the output node; and a current sink transistor controlled by the second bias voltage to discharge the output node.

The current source transistor may be a PMOS transistor including a source connected to the source voltage, a drain connected to the output node, and a gate connected to the first output signal. The current sink transistor may be a NMOS transistor including a drain connected to the output node, a source connected to the ground voltage, and a gate connected to the second bias voltage.

The differential amplifier may include: a first NMOS transistor including a drain connected to the first node, a source, and a gate connected to the first differential input signal; a second NMOS transistor including a drain connected to the second node, a source connected to the source of the first NMOS transistor, and a gate connected to the second differential input signal; a first PMOS transistor including a source connected to the source voltage, a drain connected to the first node, and a gate connected to the first node; a second PMOS transistor including a source connected to the source voltage, a drain connected to the second node, and a gate connected to the first node; a first bias transistor including a drain connected to the sources of the first and second transistors, a source, and a gate connected to the first bias voltage; and a second bias transistor including a drain connected to the source of the first bias transistor, a source connected to the ground voltage, and a gate connected to the second bias voltage.

In an exemplary embodiment of the present invention, a signal processing circuit includes: a digital-to-analog converter for converting a digital video signal into an analog video signal; and an output buffer for amplifying the analog video signal and providing the amplified analog video signal to a display panel. The output buffer includes: a differential amplifier for differentially amplifying first and second differential input signals to generate first and second output signals through first and second nodes; a driver for driving an output node in response to the second output signal; and a drive current adjuster for adjusting a driving current of the driver in response to the first output signal. The drive current adjuster includes: a first transistor including a drain connected to the output node, a gate, and a source connected to a ground voltage; a second transistor including a gate connected to the firs node, a drain, and a source connected to a source voltage; a third transistor including a drain connected to the drain of the second transistor, a source, and a gate connected to a first bias voltage; and a fourth transistor including a drain connected to the source of the third transistor, a source connected to the ground voltage, and a gate connected to a second bias voltage, wherein the gate of the first transistor is commonly connected to the drains of the second and third transistors.

The signal processing circuit may further include a source drive integrated circuit.

In an exemplary embodiment of the present invention, a differential amplifier for differentially amplifying first and second differential input signals to generate first and second output signals through first and second nodes includes: a first NMOS transistor including a drain connected to the first node, a source, and a gate connected to the first differential input signal; a second NMOS transistor including a drain connected to the second node, a source connected to the source of the first NMOS transistor, and a gate connected to the second differential input signal; a first PMOS transistor including a source connected to the source voltage, a drain connected to the first node, and a gate connected to the first node; a second PMOS transistor including a source connected to the source voltage, a drain connected to the second node, and a gate connected to the first node; a first bias transistor including a drain connected to the sources of the first and second transistors, a source, and a gate connected to the first bias voltage; a second bias transistor including a drain connected to the source of the first bias transistor, a source connected to the ground voltage, and a gate connected to the second bias voltage; a driver for driving an output node in response to the second output signal; and a drive current adjuster for adjusting a driving current of the driver in response to the first output signal.

BRIEF DESCRIPTION OF THE DRAWINGS

The present invention will become readily apparent to those of ordinary skill in the art when descriptions of exemplary embodiments thereof are read with reference to the accompanying drawings.

DETAILED DESCRIPTION OF EXEMPLARY EMBODIMENTS

Figure 1:
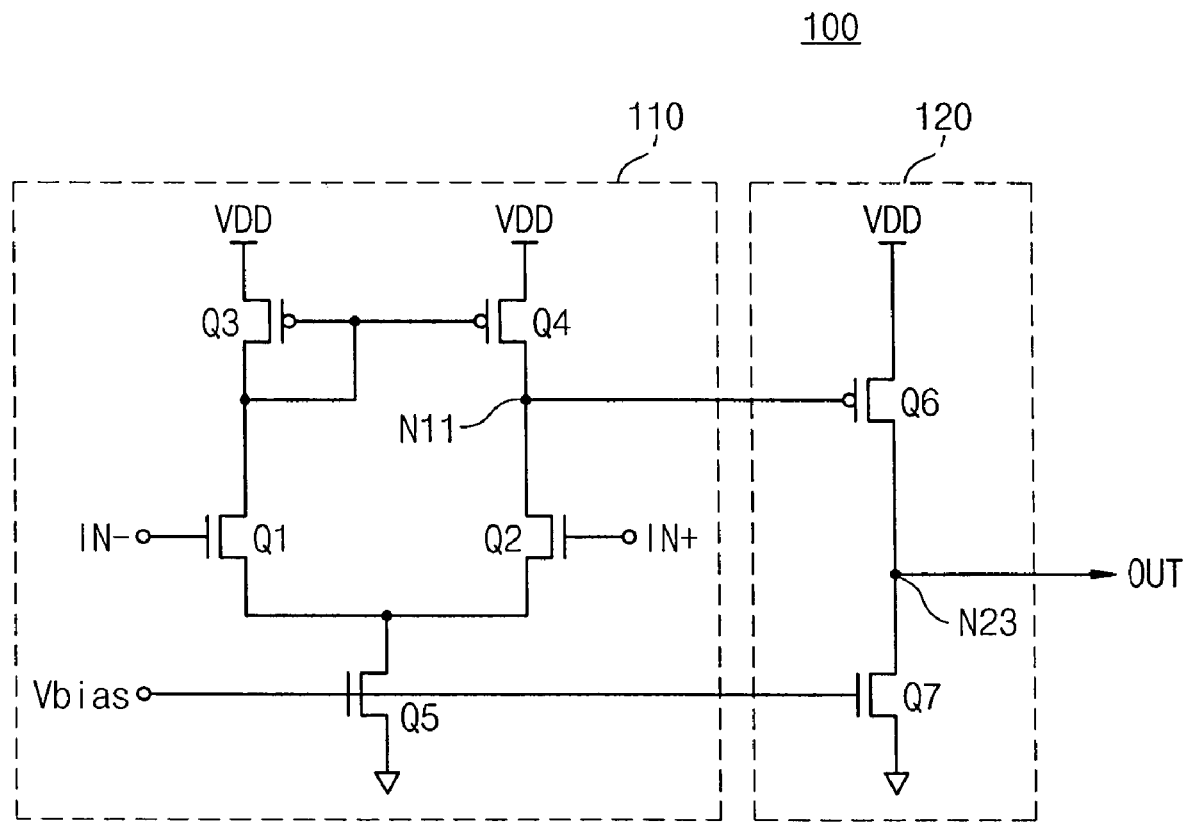
FIG. 1 is a circuit diagram of a conventional two-stage operational amplifier.
Figure 2:
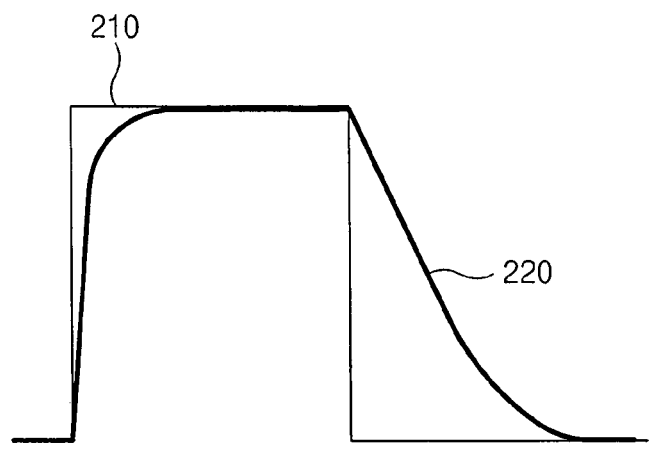
FIG. 2 is a diagram illustrating, both, an input signal inputted to an input terminal of the two-stage operational amplifier shown in FIG. 1, and an output signal outputted through an output node thereof.

Hereinafter, exemplary embodiments of the present invention will be described in detail with reference to the accompanying drawings. Like reference numerals refer to similar of identical elements throughout the description of the figures.

Figure 3:
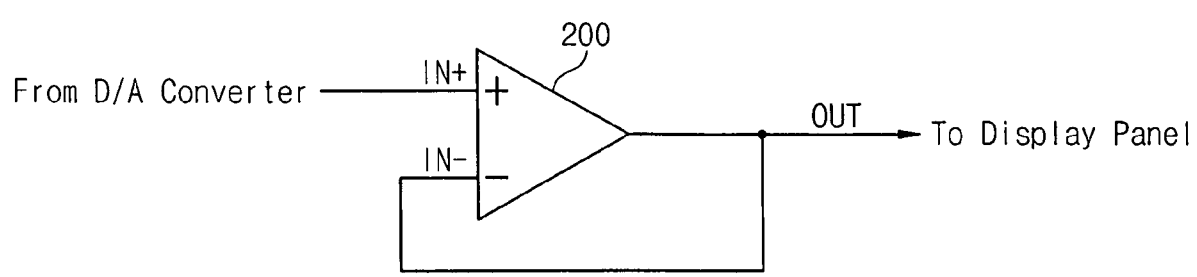
FIG. 3 is a diagram illustrating a case where an operational amplifier is used as an output buffer in a source drive IC of an LCD according to an exemplary embodiment of the present invention.

FIG. 3 is a diagram illustrating a case where an operational amplifier is used as an output buffer in a source drive IC of an LCD according to an exemplary embodiment of the present invention.

Referring to FIG. 3, the source drive IC converts a digital video signal received from a timing controller (not shown) into an analog video signal and provides the analog video signal to a display panel (not shown). In an operational amplifier 200, an output signal OUT is fed back to an inverting input terminal (−). The operational amplifier 200 serves as a buffer for amplifying and outputting an analog video signal that is inputted from a D/A converter (not shown) to its noninverting input terminal. The output signal OUT of the operational amplifier is supplied to the display panel. Although the operational amplifier 200 has been described as serving as an output buffer in a source drive IC of an LCD according to an exemplary embodiment of the present invention, it is to be understood that the operational amplifier 200 may also be applied to various other types of circuits.

Figure 4:
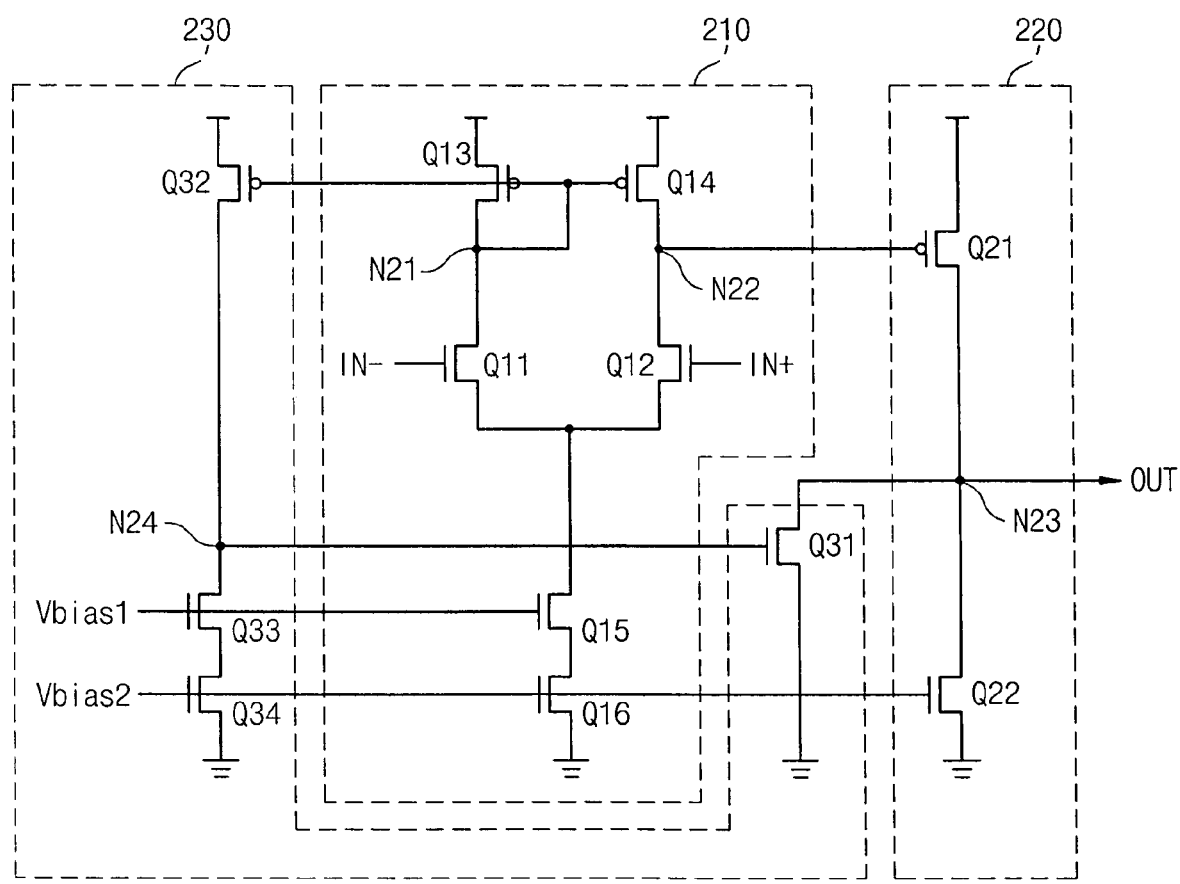
FIG. 4 is a circuit diagram of the operational amplifier shown in FIG. 3.

FIG. 4 is an exemplary circuit diagram of the operational amplifier 200 shown in FIG. 3. Referring to FIG. 4, the operational amplifier 200 includes a differential amplifier 210, a driver 220, and a driver current adjuster 230. The differential amplifier 210 differentially amplifies an inverted input signal IN− and a noninverted input signal IN+. The driver 220 charges/discharges an output node N23 by the differentially amplified signals. The drive current adjuster 230 adjusts a drive current of the driver 220 in response to the differentially amplified signals and first and second bias voltages Vbais1 and Vbias2.

Hereinafter, the structures and operations of the differential amplifier 210, the driver 220 and the drive current adjuster 230, according to an exemplary embodiment of the present invention, will be described in detail with reference to FIG. 4.

Referring to FIG. 4, the differential amplifier 210 includes NMOS transistors Q11 and Q12 respectively receiving a differential pair of input signals IN− and IN+, PMOS transistors Q13 and Q14 serving as active loads, and NMOS transistors Q15 and Q16 to which the bias voltages Vbias1 and Vbias2 are connected.

The NMOS transistor Q11 has a drain connected to a first node N21, a source, and a gate connected to the inverted input signal IN−. The NMOS transistor Q12 has a drain connected to a second node N22, a source connected to the source of the NMOS transistor Q11, and a gate connected to the noninverted input signal IN+. The PMOS transistor Q13 has a source connected to a source voltage, a gate and a source commonly connected to the first node N21. The PMOS transistor Q14 has a source connected to the source voltage, a is drain connected to the second node N22, and a gate connected to the first node N21. The NMOS transistor Q15 has a drain connected to the sources of the NMOS transistors Q11 and Q12, a source, and a gate connected to the first bias voltage Vbias1. The NMOS transistor Q16 has a drain connected to the source of the NMOS transistor Q15, a source connected to a ground voltage, and a gate connected to a second bias voltage Vbias2.

The driver 220 includes a current source transistor Q21 driven by an output signal of the second node N22 to charge the output node N23, and a current sink transistor Q22 for discharging the output node N23. In an exemplary embodiment of the present invention, the current source transistor Q21 is a PMOS transistor having a source connected to the source voltage, a drain connected to the output node N23, and a gate connected to the second node N22. In an exemplary embodiment of the present invention, the current sink transistor Q22 is an NMOS transistor having a drain connected to the output node N23, a source connected to the ground voltage, and a gate connected to the second bias voltage Vbias2.

The drive current adjuster 230 includes, for example, NMOS transistors Q31, Q33 and Q34, and a PMOS transistor Q32. The NMOS transistor Q31 has a drain connected to the output node N23, a source connected to the ground voltage, and a gate. The NMOS transistor Q31 is connected in parallel to the NMOS transistor Q22 of the driver 220 to discharge the output node N23. By including the NMOS transistor Q31, the operational amplifier 200 can provide a more improved slew rate than a discharge operation performed using only the NMOS transistor Q22.

The PMOS transistor Q32 has a source connected to the source voltage, a drain, and a gate connected to the first node N21. The NMOS transistor Q33 has a drain connected to the drain of the PMOS transistor Q32, a source, and a gate connected to the first bias voltage Vbias1. The NMOS transistor Q34 has a drain connected to the source of the NMOS transistor Q33, a source connected to the ground voltage, and a gate connected to the second bias voltage Vbias2. In an exemplary embodiment of the present invention, the gate of the NMOS transistor Q31 is connected to a node N24 to which the drains of the transistors Q32 and Q33 are commonly connected.

Hereinafter, operations of the operational amplifier 200 according to an exemplary embodiment of the present invention will be described in detail.

First, an operation of the operational amplifier 20 at the quiescent state will be described. Here, the quiescent state corresponds to a common mode where the inverted and noninverted input signals IN− and IN+ have the same voltage level.

The first and second bias voltages Vbias1 and Vbias2 are respectively applied to the gates of the bias NMOS transistors Q15 and Q16 so that a constant current flows through the transistors Q15 and Q16. In an exemplary embodiment of the present invention, to maximize an input common mode range of the differential amplifier 210, the first and second bias voltages Vbias1 and Vbias2 are set slightly higher than the threshold voltages of the NMOS transistors Q15 and Q16. For the NNOM transistors Q15 and Q16 to lie in a saturation state, each drain-source voltage difference Vds must be greater than a voltage difference between the applied bias voltage and the threshold voltage. In the quiescent state, the current "I/2" (i.e., one half of a bias current "I") flows through each of the NMOS transistors Q11 and Q12. A current "I/2×(the ratio of the size of the PMOS transistors Q14 and Q21)" flows through the PMOS transistor Q21. A current due to the second bias voltage Vbias2 flows through the NMOS transistor Q22. In an exemplary embodiment of the present invention, the sizes of the transistors Q21 and Q22 are determined according to the output load connected to the output node n23 so that there may be no input offset.

When the PMOS transistor Q32 and the PMOS transistor Q13 are the same size, the current "I/2" flows through the PMOS transistor Q32. When the NMOS transistors Q33 and Q34 are set to operate in a linear region through the adjustment of the drain-source voltages thereof, the voltage level of the node N24 becomes lower than the threshold voltage of the NMOS transistor Q31, and thus the NMOS transistor Q31 is turned off.

Second, an operation of the operational amplifier 20 at the time when the noninverted input signal IN+ transitions from a low level to a high level will now be described. When the noninverted signal IN+ transitions from the low level to the high level, by the maximum signal variation width, the voltage difference between the noninverted and inverted input signals IN+ and IN− becomes the maximum. In such case, the current "I", which has flowed through the NMOS transistors Q16 and Q15, flows through the NMOS transistor Q12. Accordingly, the voltage at the second node N22 is lowered, at or near to the ground voltage, and thus the current driving capability of the PMOS transistor Q21 becomes the maximum.

Meanwhile, since no current flows through the NMOS transistor Q11, no current flows through the PMOS transistors Q13 and Q32. Accordingly, the voltage at the node N24 approaches the ground voltage, and thus the NMOS transistor Q31 is turned off. Therefore, the output node N23 is fully charged to the source voltage by the PMOS transistor Q21.

Third, an operation of the operational amplifier 20 at the time when the noninverted input signal IN+ transitions from the low level to the high level will now be described. When the noninverted signal IN+ transitions from the high level to the low level, by the maximum signal variation width, a voltage difference between the noninverted and inverted input signals IN+ and IN− becomes the maximum. In such case, the current "I", which has flowed through the NMOS transistors Q16 and Q15, primarily flows through the NMOS transistor Q11, and almost no current flows through the PMOS transistors Q13 and Q32.

In an exemplary embodiment of the present invention, since the current "I" flows through the PMOS transistor Q13 and since the gate of the PMOS transistor Q32 is connected to the first node 21, the current flowing through the PMOS transistor Q32 is determined according to the sizes of the PMOS transistors Q13 and Q32.

A voltage at the node N24 is determined according to the sizes of the transistors Q32 to Q34 and must be set high enough to turn on the NMOS transistor Q21. In an exemplary embodiment of the present invention, the drive current adjuster 230 includes the three transistors Q32 to Q34 serially connected between the source voltage and the ground voltage, enabling the voltage at the node N24 to fully turn on the NMOS transistor Q21.

For example, when only the PMOS transistor Q32 and the NMOS transistor Q34 (except the NMOS transistor Q33) are serially connected between the source voltage and the ground voltage, a voltage at the node 24 connecting the transistors Q32 and Q34 is varied according to transistor process variation. When the turn on/off states of the NMOS transistor Q31 are varied due to the variation in the voltage level of the node N24, the discharge variation of the output node N23 is increased, which means a variation in the slew rate.

When the operational amplifier 200 is used as the output buffer in the source drive IC of the LCD, as described above, the output node N23 is connected to the pixels of the LCD panel. Each pixel includes a capacitor and its brightness is varied according to an electric charge stored in the capacitor. In an exemplary embodiment of the present invention, the drive current adjuster 230 has the NMOS transistor Q33 connected in cascade between the PMOS transistor Q32 and the NMOS transistor Q34, thereby increasing the voltage at the node N24 by the threshold voltage of the NMOS transistor Q33. Consequently, the NMOS transistor Q31 is fully turned on and thus the output load connected to the output node N23 is rapidly discharged. The rapid discharge of the stored electric charge improves the response time of the LCD.

Moreover, the variation width of the discharge slew rate at the output node N24 is reduced due to the reduced variation in the voltage level of the output node N24 according to the process variation. This reduced variation width guarantees a stable operation of the output load connected to the operational amplifier 200.

In an exemplary embodiment of the present invention, the operational amplifier 200 includes the NMOS transistor Q31 connected to the output node N23, improving a slew rate at a falling edge of the output signal. Also, the operational amplifier 200 includes the transistors Q32 to Q34 for controlling the NMOS transistor Q31, reducing a variation in the slew rate. Accordingly, a stable operation of the output load that is connected to the operational amplifier 200 is guaranteed.

The operational amplifier 200, according to exemplary embodiment of the present invention, includes the drive current adjuster 230 including the NMOS transistors Q31, Q33 and Q34 and the PMOS transistor Q32 without increasing the current in the quiescent state of the NMOS transistor Q22 so as to improve the slew rate at the falling edge of the output signal.

As described above, the operational amplifier according to exemplary embodiments of the present invention can improve the slew rate without increasing the static power consumption. The operational amplifier according to exemplary embodiments of the present invention can reduce the variation of the slew rate at the falling edge of the output signal. Accordingly, the stable operation of the output load that is connected to the operational amplifier can be guaranteed.

Although the exemplary embodiments of the present invention have been s described with reference to the accompanying drawings for the purpose of illustration, it is to be understood that the inventive processes and apparatus are not to be construed as limited thereby. It will be readily apparent to those of ordinary skill in the art that various modifications to the foregoing exemplary embodiments can be made without departing from the scope of the invention as defined by the appended claims, with equivalents of the claims to be included therein.

What is claimed is:

1. An operational amplifier comprising:
   a differential amplifier for differentially amplifying first and second differential input signals to generate first and second output signals through first and second nodes;
   a driver for driving an output node in response to the second output signal; and
   a drive current adjuster for adjusting a driving current of the driver in response to the first output signal, wherein the drive current adjuster comprises:
      a first transistor including a drain connected to the output node, a gate, and a source connected to a ground voltage;
      a second transistor including a gate connected to the first node, a drain, and a source connected to a source voltage;
      a third transistor including a drain connected to the drain of the second transistor, a source, and a gate connected to a first bias voltage; and
      a fourth transistor including a drain connected to the source of the third transistor, a source connected to the ground voltage, and a gate connected to a second bias voltage,
      wherein the gate of the first transistor is commonly connected to the drains of the second and third transistors.

2. The operational amplifier of claim 1, wherein the driver comprises:
   a current source transistor controlled by the second output signal to charge the output node; and
   a current sink transistor controlled by the second bias voltage to discharge the output node.

3. The operational amplifier of claim 2, wherein the current source transistor is a PMOS transistor including a source connected to the source voltage, a drain connected to the output node, and a gate connected to the first output signal.

4. The operational amplifier of claim 2, wherein the current sink transistor is a NMOS transistor including a drain connected to the output node, a source connected to the ground voltage, and a gate connected to the second bias voltage.

5. The operational amplifier of claim 1, wherein the differential amplifier comprises:
   a first NMOS transistor including a drain connected to the first node, a source, and a gate connected to the first differential input signal;
   a second NMOS transistor including a drain connected to the second node, a source connected to the source of the first NMOS transistor, and a gate connected to the second differential input signal;
   a first PMOS transistor including a source connected to the source voltage, a drain connected to the first node, and a gate connected to the first node;
   a second PMOS transistor including a source connected to the source voltage, a drain connected to the second node, and a gate connected to the first node;
   a first bias transistor including a drain connected to the sources of the first and second transistors, a source, and a gate connected to the first bias voltage; and a second bias transistor including a drain connected to the source of the first bias transistor, a source connected to the ground voltage, and a gate connected to the second bias voltage.

6. A signal processing circuit comprising:
a digital-to-analog converter for converting a digital video signal into an analog video signal; and
an output buffer for amplifying the analog video signal and providing the amplified analog video signal to a display panel, wherein
the output buffer comprises:
  a differential amplifier for differentially amplifying first and second differential input signals to generate first and second output signals through first and second nodes;
  a driver for driving an output node in response to the second output signal; and
  a drive current adjuster for adjusting a driving current of the driver in response to the first output signal, wherein
  the drive current adjuster comprises:
    a first transistor including a drain connected to the output node, a gate, and a source connected to a ground voltage;
    a second transistor including a gate connected to the first node, a drain, and a source connected to a source voltage;
    a third transistor including a drain connected to the drain of the second transistor, a source, and a gate connected to a first bias voltage; and
    a fourth transistor including a drain connected to the source of the third transistor, a source connected to the ground voltage, and a gate connected to a second bias voltage,
    wherein the gate of the first transistor is commonly connected to the drains of the second and third transistors.

7. The signal processing circuit of claim 6, further comprising a source drive integrated circuit.

8. A differential amplifier for differentially amplifying first and second differential input signals to generate first and second output signals through first and second nodes, the differential amplifier comprising:
  a first NMOS transistor including a drain connected to the first node, a source, and a gate connected to the first differential input signal;
  a second NMOS transistor including a drain connected to the second node, a source connected to the source of the first NMOS transistor, and a gate connected to the second differential input signal;
  a first PMOS transistor including a source connected to a source voltage, a drain connected to the first node, and a gate connected to the first node;
  a second PMOS transistor including a source connected to the source voltage, a drain connected to the second node, and a gate connected to the first node;
  a first bias transistor including a drain connected to the sources of the first and second transistors, a source, and a gate connected to the first bias voltage;
  a second bias transistor including a drain connected to the source of the first bias transistor, a source connected to the ground voltage, and a gate connected to the second bias voltage;
  a driver for driving an output node in response to the second output signal; and
  a drive current adjuster for adjusting a driving current of the driver in response to the first output signal.

9. The differential amplifier of claim 8, wherein the driver comprises:
  a current source transistor controlled by the second output signal to charge the output node; and
  a current sink transistor controlled by the second bias voltage to discharge the output node.

10. The differential amplifier of claim 9, wherein the current source transistor is a PMOS transistor including a source connected to the source voltage, a drain connected to the output node, and a gate connected to the first output signal.

11. The differential amplifier of claim 9, wherein the current sink transistor is a NMOS transistor including a drain connected to the output node, a source connected to the ground voltage, and a gate connected to the second bias voltage.

12. The differential amplifier of claim 8, wherein the drive current adjuster comprises:
  a first transistor including a drain connected to the output node, a gate, and a source connected to a ground voltage;
  a second transistor including a gate connected to the firs node, a drain, and a source connected to a source voltage;
  a third transistor including a drain connected to the drain of the second transistor, a source, and a gate connected to a first bias voltage; and
  a fourth transistor including a drain connected to the source of the third transistor, a source connected to the ground voltage, and a gate connected to a second bias voltage,
  wherein the gate of the first transistor is commonly connected to the drains of the second and third transistors.

* * * * *